United States Patent [19]

Holbrook et al.

[11] Patent Number: 4,855,792
[45] Date of Patent: Aug. 8, 1989

[54] OPTICAL ALIGNMENT SYSTEM FOR USE IN PHOTOLITHOGRAPHY AND HAVING REDUCED REFLECTANCE ERRORS

[75] Inventors: David S. Holbrook, Woburn; Craig R. Simpson, Arlington, both of Mass.

[73] Assignee: MRS Technology, Inc., Chelmsford, Mass.

[21] Appl. No.: 193,887

[22] Filed: May 13, 1988

[51] Int. Cl.⁴ ............................................. G03B 27/52
[52] U.S. Cl. ....................................... 355/53; 356/400
[58] Field of Search ........................... 355/53, 54, 43; 356/375, 400, 401; 250/548

[56] References Cited

U.S. PATENT DOCUMENTS

| | | | |
|---|---|---|---|
| 4,540,277 | 9/1985 | Mayer et al. | 355/53 |
| 4,623,608 | 11/1986 | Andrevski | 355/43 X |
| 4,629,313 | 12/1986 | Tanimoto | 355/53 |
| 4,701,053 | 10/1987 | Ikenaga | 356/375 |
| 4,711,567 | 12/1987 | Tanimoto | 355/53 |
| 4,769,680 | 9/1988 | Resor, III et al. | 355/53 X |

Primary Examiner—Richard A. Wintercorn
Attorney, Agent, or Firm—Haynes N. Johnson

[57] ABSTRACT

A direct reticle reference alignment system for use in photolithography for use with substrates having optical transmissivity. The system includes a movable stage (14), a transmissive substrate (11) held by the stage and bearing at least one plate mark (15) upon its upper surface, an optical system having a light source (1) for illuminating and projecting a reticle alignment image (4) upon the substrate (11) for alignment with the plate mark (15), a sensor (17) mounted in the stage (14) below the substrate (11) and the plate mark (15) to receive light from the projected alignment image (4), the sensor (17) producing an electrical signal related to the degree of alignment, and a stage control actuated by the signal to position the stage (14) and, so, align the substrate (11) with the reticle (4). The sensor (17) includes a light channel (19), such as a fiber optic rod, positioned to receive images from the lower surface (13) of said substrate (11) and carry them to the photocell. The detector may include a quadcell and a corresponding light channel for each cell in the quadcell.

19 Claims, 2 Drawing Sheets

OPTICAL ALIGNMENT SYSTEM FOR USE IN PHOTOLITHOGRAPHY AND HAVING REDUCED REFLECTANCE ERRORS

FIELD OF THE INVENTION

This invention relates to the field of photolithography and, in particular, to through-the-lens ("TTL") alignment systems for aligning a reticle with a stage carrying a transparent substrate, such as a partially processed liquid crystal display ("LCD"). It is directed to a detection system for alignment in which the sensor is mounted in the stage and receives a projected alignment signal which has been transmitted through the lens and substrate.

The invention also relates to the correction of errors which arise when a substrate must be positioned to an accuracy of fractions of a micrometer. These include errors arising from internal reflections within a transparent substrate and errors which arise from the non-uniform sensitivity over the surface of detecting photocells.

RELATED APPLICATION

The alignment system of our invention may be used in the apparatus and method for making large area electronic devices set forth in copending U.S. patent application Ser. No. 111,427, filed Oct. 22, 1987 now U.S. Pat. No. 4,769,680, issued Sept., 6, 1988, owned by a common assignee. The disclosure of that patent is incorporated by reference.

BACKGROUND OF THE INVENTION

Various alignment systems are known and can be found, inter alia, in the following U.S. Pat. Nos.: 4,540,277 Mayer et al.; 4,629,313 Tanimoto; 4,701,053 Ikenaga;

The prior art, however, fails to show a transmission alignment system usable for the direct alignment of transparent substrates. Mayer uses an adjustment plate which is inserted in the stage in the place of a wafer, and uses a separate alignment light. Tanimoto uses a stage detector that is positioned to one side of the wafer, and an alignment microscope. Ikenaga uses a detector which is below, not in, the stage, resulting in structural problems. The prior art does not disclose a detection system which uses transparent or transmissive substrates, in-stage detectors positioned so as to be underneath the substrate, and means for the reduction of reflection errors, nor does the prior art use a through the lens system (TTL), with in-stage sensors, for alignment.

For prior art detectors below the stage, such as Ikenaga, to be usable, a big cut-out area in the stage was required. This left inadequate gravity support for the wafer unless a glass support were used; and such support meant that the photocell would have to be too far removed from the wafer to be accurate. As a result, the use of reflective systems has become prevalent.

Our system permits the use of a more accurate transmission alignment system.

BRIEF SUMMARY OF THE INVENTION

Our alignment system is used with transparent or translucent substrates, i.e., transmissive substrates, such as glass in partially processed LCD's. It functions by sensing the optical field which has been transmitted through the substrate as precise slit-edges of light projected from alignment slits in a reticle.

Our system can be used with a single sensor beneath the substrate. Preferably, however, at least two, and sometimes three sensors are used to determine position in X- and Y-directions and in $\theta$ (rotation). By using three sensors one can control six variables, i.e., X- and Y-direction, $\theta$, X-scale, Y-scale, and orthogonality.

All the sensors would be so positioned as to be beneath the substrate, but should be as far removed from one another as possible, to give greater accuracy. Normally, one sensor would be near the X,Y origin, a second placed a distance in the X-direction, and a third placed a distance in the Y-direction, each detector preferably being placed near a corner of the substrate.

Each of the sensors for the alignment system fits within the movable stage of a photolithographic system. It is below the transparent substrate and receives a light image from the reticle after the light field from the image has passed through the substrate. Each sensor is preferably a quadcell, i.e., four photocells. One pair of cells is for the alignment of the substrate in the X-axis; and the other pair, for the Y-axis, thereby permitting alignment in two orthogonal directions.

The system uses two sets of corresponding slits for each sensor. They are reticle slits on the reticle and plate slits on the substrate. The plate slits are two parallel slits (plate marks) on the upper surface of the substrate for each axis, the two pairs being perpendicular (orthogonal) to one another. Light is projected through the reticle slits to the substrate and correspond in position to the image of the reticle so that the slits can be used in alignment. Each of the cells in the quadcell is associated with one of the plate marks on the transparent substrate and receives its light through that mark.

Light can be transmitted from the slits to the cells through a normal lens-type optical system in the sensor. Preferably, however, the light is transmitted through light channels such as fiber optic rods, there being a separate rod for each slit and plate mark combination. Thus, if two orthogonal pairs of slits are used at each detecting position, there would be four rods and four associated photocells at each location.

Each of the optical rods carries received light from its receiving position just beneath the lower surface of the substrate to one of the cells of the quadcell. This substantially reduces or eliminates inaccuracies in the alignment determination due to reflections within transmissive substrates, such as glass. Each optical rod also serves (through multiple internal reflections) to diffuse (scramble) the incoming light uniformly over the surface of each cell, reducing problems of non-uniform cell surface sensitivity.

DETAILED DESCRIPTION OF THE INVENTION

The task of producing integrated circuits, such as for LCD's, often requires the fabrication of a sandwich of electronically active layers. These layers must be precisely aligned to each other. Our system provides for alignment by sensing an optical field which has been transmitted through a transparent or translucent substrate, i.e., sensing slit-edges of light which have been projected from a reticle to corresponding slits (plate marks) in a substrate layer. The sensors are small enough to be mounted in the stage beneath the substrate.

Figure 1:
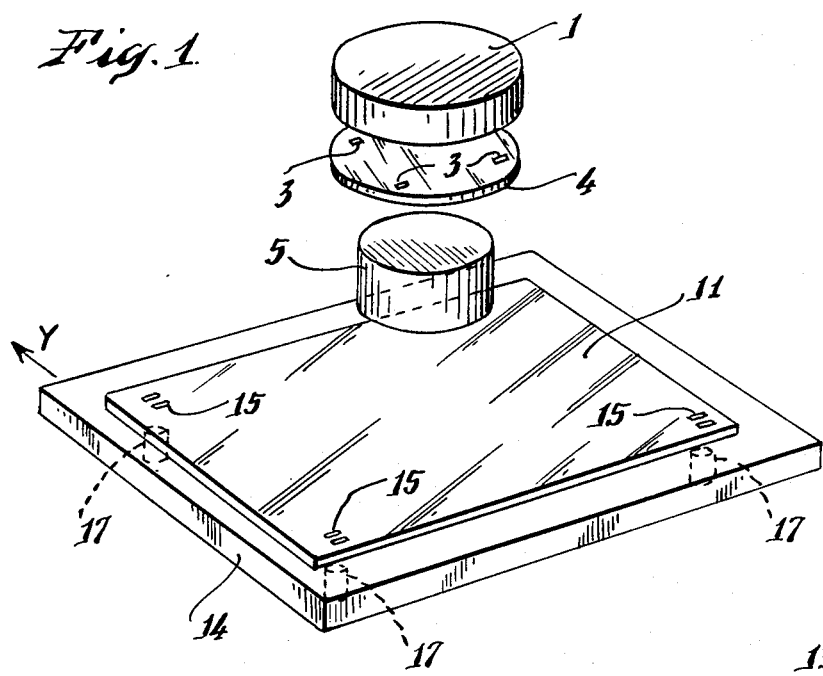
FIG. 1 is a simplified perspective view of a projection system showing a reticle with alignment slits between a light source and a projected lens, so positioned that the image of the alignment slits is directed to substrate plate marks located over the sensors in a movable stage.

FIG. 1 shows, in simplified perspective an optical system and stage using our alignment system. It includes a source of illumination 1, a reticle 2 with alignment slits 3, and a projection lens 5. The reticle carrier is not shown, but may be of any customary type. A neutral density filter 8 may be placed between the light source 1 and reticle 2 during alignment to reduce the exposure received by the photoresist (See FIG. 2). A stage 14, movable in at least X- and Y-directions is positioned below the lens. It is of the usual type (except for the detectors) and holds and carries transmissive substrate 11.

Stage 14 includes at least one, and preferably two or three, in-stage sensors 17. The sensors, which are below the substrate 11, are best located remotely from one another, near corners of substrate 11, but still beneath substrate 11. For example, as shown in FIG. 1, one is near the origin, another is in the extreme X-direction from the origin, and the other is in the extreme Y-direction from the origin.

Figure 2:
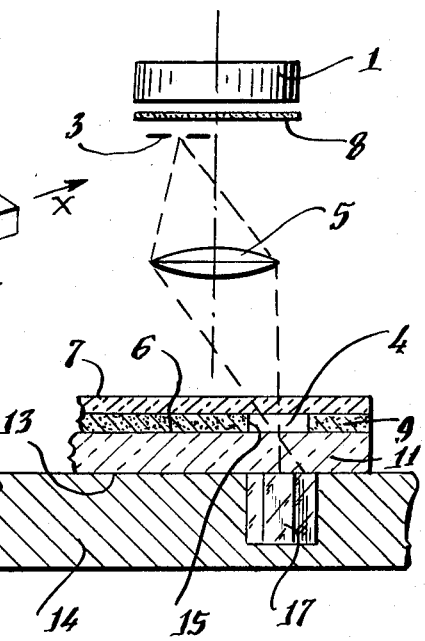
FIG. 2 is a representation (not to scale) of the general operation of an alignment system through a transmissive substrate.

The basic optics are shown in FIG. 2. Light source 1, controlled by adjustable shutter blades (not shown), serves to illuminate an object 3 (a pair of skits in a predetermined located on a reticle 2). Projection lens 5 forms an image 4 of the object upon the upper surface 6 of substrate 11. Since the substrate is transparent or translucent, an alignment sensor 17 below substrate 11 can detect the light from an image on upper surface 6.

Normally, the substrate will have a previously-formed, partially-opaque electronic layer 9 on it and a transparent or translucent photoresist layer 7 formed upon its upper surface. The electronic layer 9 has alignment pairs of plate slits (plate marks) 15 in it. These plate slits 15 correspond to and complement the light image 4 from reticle slits 3 that are projected from the reticle 2 (see FIGS. 3,4,7, and 9). Slits 15 are to be aligned with light image 4.

Thus, each set of plate marks 15 will consist of two pairs of parallel slits orthogonal to each other; and there will be a corresponding set of reticle slits 3.

Preferably, the alignment image 4 is projected through the same lens (TTL) as the circuit image to be projected, using the same light source (actinic light) as is used to perform the exposure. This insures that, in spite of any lens aberrations, there will be no change in image position between alignment and exposure. This is called a direct reticle reference system.

Alignment is achieved by moving stage 14 in X-, Y-, and θ-directions as may be required. Alternatively, it may be done by adjustment of the position of the reticle. Alignment, as described below, can be achieved by moving the stage relative to the reticle by any customary means or as described in the above-mentioned patent application. The movement is controlled by electrical signals derived from the sensors.

One drawback in using actinic light to perform alignment is the part of the photoresist layer 7 over the plate mark 15 will be lost (during the subsequent etching step) due to exposure during alignment. This problem can be solved by limiting the exposure dose given to the photoresist by placing neutral density filter 8 between the light source 1 and the reticle slit 3 during the slignment process, since photoresist which has been only slightly exposed will not develop completely.

Transparent substrate 11 is carried by a stage 14, the stage being movable in the X-, Y-, and θ-directions. Sensors 17 are mounted within the stage 14 in positions so as to be almost in contact with the lower surface 13 of substrate 11, about 100 microns below, and to receive a light field (image 4 ) through the substrate. See FIGS. 2 and 8.

A problem in design of an alignment system with transmissive sensing is the physical size of the sensor. In our invention, the sensor is preferably sufficiently small so that it can ride within the stage rather than having to be attached to the instrument base; this eliminates stage complexing and compromise of mechanical integrity. The resulting lower cost is important since it permits multiple sensors to be mounted and so provide more positional information.

Our transmission alignment system employs a relatively simple principle. A slit opening 3 (reticle slit) on the reticle 2 is projected onto the upper surface 6 of the transparent substrate 11, forming a slit image 4. When the reticle slit image 4 is near the plate mark 15 (the plate slit in the electronic layer), some of the light will be transmitted through the plate mark 15 to the in-stage sensor 17. As the substrate 11 is moved (by relative motion of stage 14 with respect to the slit image 4), more or less of the image light will be transmitted (see FIGS. 3 and 4). The light transmitted will be a function of substrate (stage) position.

Figure 3:
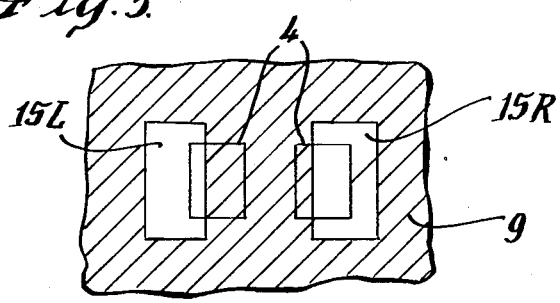
FIG. 3 is a plan view of a pair of reticle slit images projected onto a pair of substrate slits. In the illustration the slits are out of alignment with the plate marks.
Figure 4:
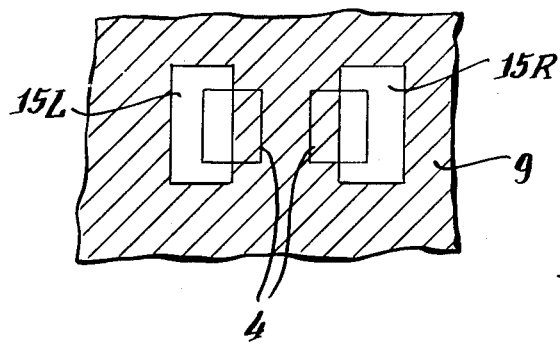
FIG. 4 is the same as FIG. 3, except that the slits are in alignment.

In practice it is better to employ a pair of parallel reticle slits 3 and a pair of corresponding substrate slits (plate slits) 15. This allows the exploitation of the symmetry difference when the plate marks 15 and reticle slit images 4 are misaligned. This avoids any problem from under or over exposure, or non-uniform etch, of the photoresist surface. FIG. 3 shows these overlapping two pairs misaligned; and FIG. 4 shows them aligned. A sensor 17 is underneath each overlapping set, e.g., image 4 and plate mark 15L as one set and image 4 and plate mark 15R as another set, and electrical signals are produced which correspond to the light received at each detector and also to the difference in light transmitted through the left plate mark 15L as compared to the right plate mark 15 R. These electrical signals are functionally related to the degree of alignment.

Figure 5:
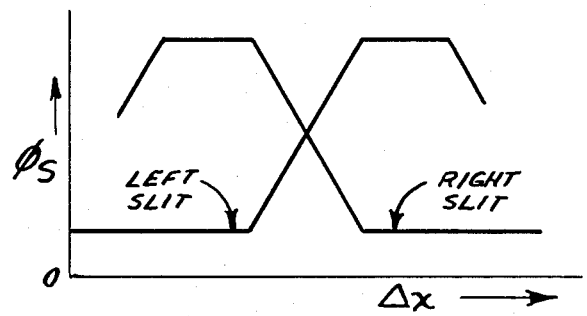
FIG. 5 is a graph showing received light intensity plotted against alignment error.

FIG. 5 is a graph depicting the relativelight flux (ordinate) received through a pair of plate marks 15L and 15R relative to position in the X-axis direction (abscissa). The point where the two curves cross (delta X=0) is the balance point (point of correct alignment). This light flux can be converted into an electrical voltage signal by sensing it with sensor 17.

Figure 6:
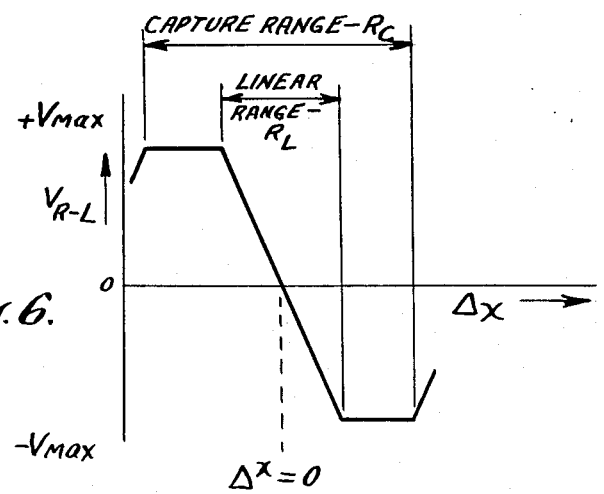
FIG. 6 is a similar plot, but shows the differences in transmitted light between the left and right slits.

The data of FIG. 5 are depicted in slightly different form in FIG. 6., which depicts the difference in voltage signals between left and right slit sensors; and the sets of slits are aligned when the difference is zero (delta X=0). Since the signal is linear, positioning control is easier with this system. As can be seen, the linear range is limited, but the nature of the signal allows a large capture range because the sign of the signal indicates the direction of misalignment and, so, the direction in which the stage must be moved to achieve alignment.

A computer may be used to receive the electrical signals from the sensors and to use them to automatically control movement of stage 14 until alignment is achieved. Alternatively, the computer may control movement of the reticle carrier to achieve alignment.

The use of these voltage difference signals enhances the "capture range" of the in-stage detectors 17 in that the wafer substrate 14 can be initially mispositioned on the stage to a greater extent and still permit automatic alignment.

If the slit widths of the plate mark 15 ($W_p$) are larger than the widths of the slit images 4 from the reticle ($W_i$), then the capture range will be $R_c = 2W_p - W_i$, and the linear range will be $R_L = W_i$.

The plate marks 15 need not be completely transparent, nor need the photoresist background be completely opaque (though lack of opacity could raise the noise level). If the marks are partially transmitting, the sensitivity of alignment to detection noise is more important because the slope of the sensor signal in the linear range (FIG. 6) is decreased.

Figure 7:
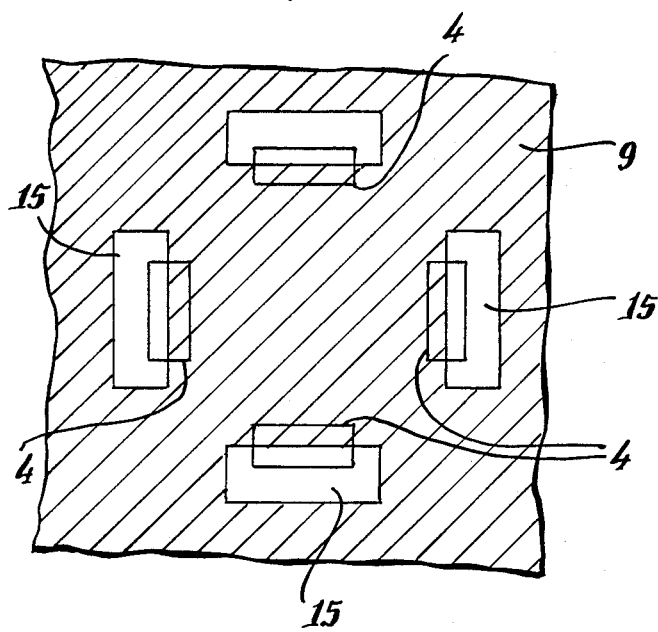
FIG. 7 similar to FIGS. 3 and 4, except shows two pairs of slits, one for the X-axis and one for the Y-axis, permitting alignment in two orthogonal directions.

By using two pairs of reticle slits 3 and two pairs of plate slits 15, perpendicular to each other, and a quadcell sensor, alignment can be achieved in both X- and Y-directions (See FIG. 7).

Figure 9:
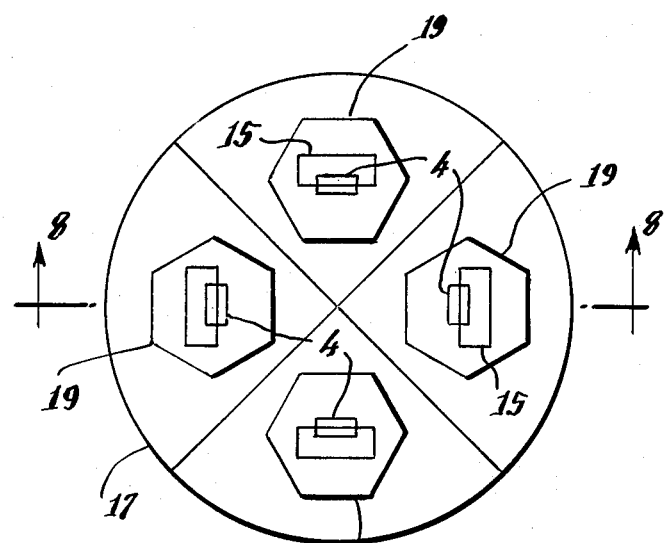
FIG. 9 is a top plan view of our sensor showing superimposed images of reticle slits and plate marks.
Figure 8:
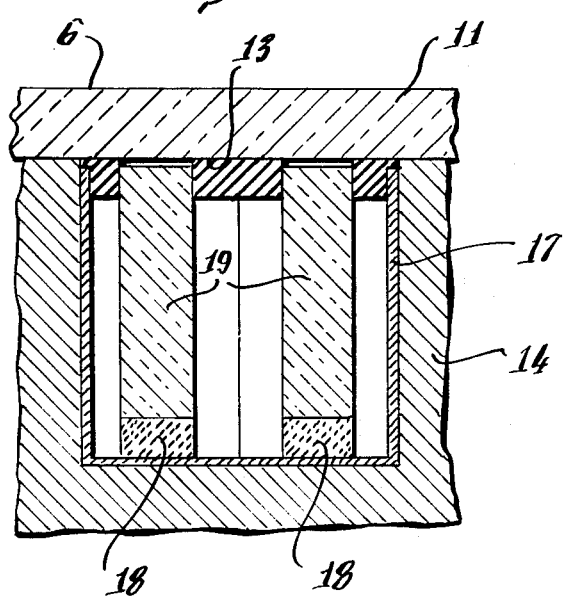
FIG. 8. is a vertical section, taken on line 8—8 of FIG. 9, through the quadcell sensor system of our invention and shows the light channels.

The quadcell sensor 17 is shown in FIGS. 8 and 9. Silicon detectors 18 have reasonable responses to actinic wavelength (such as 436 nm) and can be used. Also, the light power levels normally used are such that noise generated in detection and amplification contribute negligibly to positional error. Thus, commercially available silicon quadrant detectors will function satisfactorily.

A problem can occur with the transmission of the light through a transparent or translucent substrate to a detector. The upper and lower surfaces 6 and 13 of the substrate can cause internal reflections within the substrate and so interfere with the detection process. Normally, approximately 96% of the light passing through the plate mark 15 will be transmitted through the lower (back) side 13 of substrate 11 (FIGS. 2 and 8). The remaining 4% will be reflected back within the substrate and mostly emerge following internal reflection off the top side 6 of the substrate.

If a conventional optical system is used to relay light from the slits to the quadcell sensor 17, these within substrate reflections hinder the alignment process by allowing light transmitted through one slit to be coupled over to an unintended quadcell element, to cross over. This coupling is influenced by relative position of the plate mark with respect to the alignment sensor 17. Since the plate (and plate mark) cannot be accurately aligned to the alignment sensor in practice, this coupling must be minimized to allow accurate alignments.

This problem is overcome by using four independent light channels 19 to relay light from substrate 11 to four separate photocells 18, one for each quadrant of the sensor (rather than a single optical system). So that the channels can be separate, they are preferably made of four separate fiber optic rods 19 (normally of about 2 mm diameter each) with end faces polished and perpendicular to the rod axis. FIGS. 8 and 9. (Note that in FIG. 9 the position of slit images 4 and plate marks 15, as in FIG. 7, have been indicated for added clarity even though they would not actually be visible in that view).

The diameter of rods 19 is large enough so that the light in the ±10° cone angle exiting a typical projection lens will be "captured" by the rods 19 even if there is some misalignment between the rods 19 and the plate marks 15. Once "captured", the light will stay in the rod (due to total internal reflection) until it reaches the photocell 18 at the exit end of the rod. The detected light will be proportional to the light transmitted by the corresponding plate mark 15 and independent of the light transmitted through other plate marks. Due to the "scrambling" of the light in the rod, the detected signal will also be insensitive to positional differences between the rod and its corresponding plate mark (resulting from variations in sensitivity over the surface of the cell).

The light channels 19 may have any desired cross-sectional configuration. However, for the best "scrambling", a polygonal cross-section, such as a triangle, square, or hexagon, is preferred to a circular one.

Alternatively, the light channels 19 can be formed of hollow tubes with internally reflecting surfaces to accomplish the same result.

In practice there are small sensitivity differences between the quadcell elements. In addition, the transmission of each slit in the plate marks can be different due to non-uniformity in the film deposition process. Calibration is required to insure accurate alignment. (The film may be non-uniform from one slit region to another.) This insures that the system remains linear.

The calibration procedure is as follows: The plate is first nominally aligned in X- and Y-directions to insure that the plate is inside the sensor capture range $R_c$. The stages then scan the substrate, and the data shown in FIG. 5 is sampled. The maximum and minimum voltages are determined for each slit. These are shown in FIG. 5 as $V_{Rmax}$ and $VR_{min}$ for the right side and $V_{Lmax}$ and $V_{Lmin}$ for the left slit. The voltage offset required for alignment is given by $$V_O = \frac{V_{Rmax} + V_{Rmin} - V_{Lmax} - V_{Lmin}}{2}$$

When the stage is positioned so that $V_R - V_L = V_0$, the plate will be aligned.

It should be understood that variations from the structure disclosed may occur without departing from the spirit of our invention. For example, a different type of sensor can be used, the light channels can be eliminated, or the configuration of the reticle slits and plate marks changed.

We claim:

1. A direct reference reticle alignment system for use in photolithography and in which the substrates have optical transmissivity, said system including an illumination system for projecting an image, said illumination system including a light source, a projection lens, and a reticle carrier therebetween, a stage for supporting a substrate, said stage including stage moving means capable of moving said stage in at least X- and Y-directions, at least one sensor mounted in said stage, said sensor being positioned to be beneath and proximate to a substrate supported by said stage, whereby an optical image can be projected to said sensor from a reticle carried by said reticle carrier.

2. An alignment system as set forth in claim 1, said system including an optically-transmissive substrate supported by said stage and a reticle carried by said reticle carrier, said reticle including at least one pair of reticle slits in a predetermined location upon said reticle, said substrate including at least one pair of transmissive plate marks positioned on said substrate so as to be above said sensor when said substrate is supported on said stage, said reticle slits and said plate marks having complementary configurations, whereby said reticle marks will project an image upon said plate marks and be detected by said sensor and alignment determined thereby.

3. An alignment system as set forth in claim 2 including means associated with said sensor for creating an electrical signal functionally related to the degree of alignment of said reticle slits and said plate marks and means responsive to said signal to control said stage moving means.

4. An alignment system as set forth in claim 1 including at least two said sensors, said sensors being remotely spaced from one another.

5. An optical alignment system for use in photolithography utilizing substrates having optical transmissivity, said system including a stage, means for moving said stage in X- and Y-directions, an optically transmissive substrate carrying at least one transmissive plate mark on its upper surface, said stage having support means holding said substrate, a reticle bearing at least one alignment mark corresponding to said plate mark, at least one sensor mounted in said stage, said sensor being positioned beneath said plate mark and with its upper surface proximate to the lower surface of said substrate, means for projecting an optical image of said alignment mark upon the upper surface of said substrate and upon said plate mark, and means associated with said sensor for controlling said stage moving means, whereby said optical image can be transmitted through said substrate and said plate mark to said sensor and alignment of said substrate can be accomplished by moving said stage and said positioned substrate until said optical image bears a predetermined position above said sensor.

6. An optical alignment system as set forth in claim 5 in which said sensor includes a photocell and a light channel positioned between said photocell and said lower surface of said substrate.

7. An optical alignment system as set forth in claim 6 in which said light channel is an optical rod.

8. An optical alignment system as set forth in claim 7 in which said optical rod has a polygonal cross-section.

9. An optical alignment system as set forth in claim 7 in which said light channel has total internal reflection, whereby light passing longitudinally of said optical rod is uniformly diffused.

10. A direct reticle reference alignment system for use in photolithography for use with substrates having optical transmissivity, said system including a stage, a transmissive substrate bearing at least one plate mark upon its upper surface, said stage having support means for holding said substrate, an optical system including a reticle and having means for illuminating and projecting a reticle alignment image from said reticle upon a said supported substrate for alignment with said plate mark, means for causing relative movement in X- and Y-directions between said stage and said reticle, a sensor mounted in said stage below said substrate and said plate mark to receive light from said projected alignment image, said sensor producing an electrical signal related to the degree of alignment, and control means actuated by said signal to control said means for causing relative movement, whereby said plate mark on said substrate may be aligned with said alignment image by moving said stage in accordance with signals received from said sensor.

11. An alignment system as set forth in claim 10, in which said sensor includes a light channel positioned to receive images from the lower surface of said substrate.

12. An alignment system as set forth in claim 10 in which said sensor includes a quadcell and a corresponding light channel for each cell in said quadcell, each said light channel being positioned between the lower surface of said substrate and its respective one of said cells.

13. An alignment system as set forth in claim 12 in which said alignment image includes two pairs of parallel slits of light, said pairs being juxtaposed orthogonally with respect to each other, and in which said plate marks are two pairs of parallel transparent slits in the upper surface of said substrate corresponding to said alignment images, said pairs being juxtaposed orthogonally with respect to each other and positioned to correspond to the positioning of said slits of light, whereby said substrate can be aligned in the X- and Y-directions.

14. In a photolithographic projection system for use with transmissive substrates and having a stage for carrying one said substrate, a reticle carrier and reticle, and means for projecting and image from said reticle to the upper surface of said substrate, that improvement including at least one sensor mounted in said stage and beneath said substrate, for use in alignment of said substrate, each said sensor including a photocell and an associated light channel, said channel being positioned such that one end thereof is proximate to said photocell and the other end is proximate to the lower surface of said substrate, whereby alignment images can pass through said substrate and said channel to said photocell with reduced crossover effect.

15. A system as set forth in claim 14 in which said light channel is an optical rod.

16. A system as set forth in claim 15 in which said optical rod has a polygonal cross-section.

17. A system as set forth in claim 14 in which said photocell is a quadcell having four quadrants for detection and having four said light channels, said channels being individually positioned with one said channel for each said quadrant.

18. A system as set forth in claim 14 in which said light channel has total internal reflection.

19. A system as set forth in claim 14 including a plurality of said sensors, said sensors being remote from one another under said substrate.

* * * * *